(12) United States Patent
Jeon et al.

(10) Patent No.: US 8,427,795 B2
(45) Date of Patent: Apr. 23, 2013

(54) PAD INTERFACE CIRCUIT AND METHOD OF IMPROVING RELIABILITY OF THE PAD INTERFACE CIRCUIT

(75) Inventors: Chan-hee Jeon, Suwon-si (KR); Han-gu Kim, Seongnam-si (KR); Min-sun Hong, Seoul (KR); Tae-hoon Ha, Suwon-si (KR); Doo-hyung Kim, Suwon-si (KR); Jung-soon Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 359 days.

(21) Appl. No.: 12/656,223

(22) Filed: Jan. 21, 2010

(65) Prior Publication Data

US 2010/0208400 A1 Aug. 19, 2010

(30) Foreign Application Priority Data

Feb. 17, 2009 (KR) .......................... 10-2009-0013128

(51) Int. Cl.
*H02H 9/04* (2006.01)
(52) U.S. Cl.
USPC .......................................................... 361/56
(58) Field of Classification Search ...................... 361/56
See application file for complete search history.

(56) References Cited

U.S. PATENT DOCUMENTS

| | | | | |
|---|---|---|---|---|
| 5,615,073 | A * | 3/1997 | Fried et al. | 361/56 |
| 5,654,862 | A * | 8/1997 | Worley et al. | 361/111 |
| 6,327,126 | B1 * | 12/2001 | Miller et al. | 361/56 |
| 6,970,336 | B2 | 11/2005 | Stockinger et al. | |
| 7,042,689 | B2 | 5/2006 | Chen | |
| 7,271,629 | B2 * | 9/2007 | Jeon et al. | 327/112 |
| 2001/0053054 | A1 * | 12/2001 | Andoh | 361/56 |
| 2002/0075034 | A1 * | 6/2002 | Schroeder et al. | 326/26 |
| 2004/0212936 | A1 * | 10/2004 | Salling et al. | 361/56 |
| 2006/0202773 | A1 * | 9/2006 | Masai et al. | 331/177 V |
| 2006/0250735 | A1 * | 11/2006 | Kwon | 361/56 |
| 2010/0142105 | A1 * | 6/2010 | Linten et al. | 361/56 |

FOREIGN PATENT DOCUMENTS

| | | |
|---|---|---|
| JP | 2003-264233 | 9/2003 |
| KR | 10-2006-0091387 | 8/2006 |

* cited by examiner

*Primary Examiner* — Stephen W Jackson
*Assistant Examiner* — Angela Brooks
(74) *Attorney, Agent, or Firm* — Harness, Dickey & Pierce

(57) ABSTRACT

The pad interface circuit includes a first stack MOS transistor having a first terminal connected to a pad and a bulk connected to a first supply voltage; a second stack MOS transistor having a first terminal connected to a second terminal of the first stack MOS transistor and a second terminal, a gate terminal, and a bulk that are connected to the first supply voltage; and a voltage level sensing circuit generating a feedback voltage by using a pad voltage applied from the pad. In addition, the feedback voltage is applied to a gate terminal of the first stack MOS transistor.

17 Claims, 3 Drawing Sheets

PAD INTERFACE CIRCUIT AND METHOD OF IMPROVING RELIABILITY OF THE PAD INTERFACE CIRCUIT

CROSS-REFERENCE TO RELATED APPLICATIONS

This application claims the benefit of Korean Patent Application No. 10-2009-0013128, filed on Feb. 17, 2009, in the Korean Intellectual Property Office, the disclosure of which is incorporated herein in its entirety by reference.

BACKGROUND

Example embodiments relate to a pad interface circuit, and more particularly, to a pad interface circuit having improved reliability in regards to a voltage level of an input voltage source and a method of improving the reliability of the pad interface.

Integrated circuits consisting of semiconductors may include: function blocks performing functions, storage media used by the function blocks, and a central processing unit (CPU) controlling the function blocks. The CPU, the function blocks, and the storage media operate by using an electric source supplied from outside of the integrated circuit. In addition, control signals are supplied from the outside to be used in performing functions of the integrated circuit and signals generated in response to the control signals should be output from the integrated circuit. The signals supplied from the outside, the electric source supplied from the outside, and the signals generated in the integrated circuit are transferred through a pad.

Since the pad may become a path through which undesired electrostatic charges are induced while normal signals and the voltage source supplied from the outside of the integrated circuit are supplied through the pad, an in-out circuit that connects the pad to an internal circuit of the integrated circuit, that is, a pad interface circuit, is designed and implemented to pass the normal signals and to block undesired signals. Therefore, there is a functional difference between the interface circuits disposed between the pad and the integrated circuit when the pad is used as an input unit and as an output unit.

Conventionally, an interface circuit adopting a virtual floating well is used to solve the above problem.

Even when the integrated circuit operates the internal elements by using a supply voltage VDD, a magnitude of the supply voltage Ex_VDD supplied from the outside is generally greater than a voltage level of the supply voltage VDD. For example, when it is assumed that the magnitude of the supply voltage VDD used in the integrated circuit of a wall plug product such as a universal serial bus (USB) is 3.3V (Volts), the magnitude of the supply voltage Ex_VDD, which is applied to the pad of the integrated circuit from the outside, may be 5V. When designing the pad interface circuit of the integrated circuit, the supply voltage Ex_VDD having a higher voltage level should not affect a gate oxide layer of the interface circuit.

When the supply voltage VDD of the integrated circuit is supplied to the pad interface circuit, the functions of the pad interface circuit can be executed. However, when the voltage source VDD is not supplied to the pad interface circuit, the supply voltage Ex_VDD supplied from the outside may affect the gate oxide layers of the transistors forming the interface circuit due to structural characteristics of the interface circuit, and accordingly, lifespan of the pad interface circuit may be reduced and reliability of the pad interface circuit may be degraded.

SUMMARY

At least one embodiment provides a pad interface circuit, lifespan and reliability of which are not degraded even when a supply voltage VDD is not applied to the pad interface circuit.

At least one embodiment also provides a method of improving reliability of the pad interface circuit that may increase lifespan and improve reliability of the pad interface circuit even when the supply voltage VDD is not applied to the pad interface circuit.

According to an embodiment, there is provided a pad interface circuit including: a first stack metal oxide semiconductor (MOS) transistor having a first terminal connected to a pad and a bulk connected to a first supply voltage; a second stack MOS transistor having a first terminal connecting to a second terminal of the first stack MOS transistor and a second terminal, a gate terminal, and a bulk that are connected to the first supply voltage; and a voltage level sensing circuit generating a feedback voltage by using a pad voltage supplied from the pad, wherein the feedback voltage may be supplied to a gate terminal of the first stack MOS transistor.

According to another embodiment, there is provided a method of improving reliability of a pad interface circuit that comprises a first stack MOS transistor having a first terminal connected to a pad and a bulk connecting to a first supply voltage, and a second stack MOS transistor having a first terminal connected to a second terminal of the first stack MOS transistor and a second terminal, a gate terminal, and a bulk that are connected to the first supply voltage, the method including: applying a voltage having a voltage level that is equal to or smaller than a difference between voltage levels of the voltage source supplied from the pad and a second supply voltage that is used in a system using the pad interface circuit to the gate terminal of the first stack MOS transistor.

According to another embodiment, there is provided an integrated circuit including a pad interface circuit and a voltage level sensing circuit. The voltage level sensing circuit is configured to control an electric field applied to at least one gate oxide layer of the pad interface circuit based on a pad voltage applied to the pad interface circuit.

BRIEF DESCRIPTION OF THE DRAWINGS

Exemplary embodiments will be more clearly understood from the following detailed description taken in conjunction with the accompanying drawings in which.

DETAILED DESCRIPTION OF THE EXAMPLE EMBODIMENTS

Figure 1:
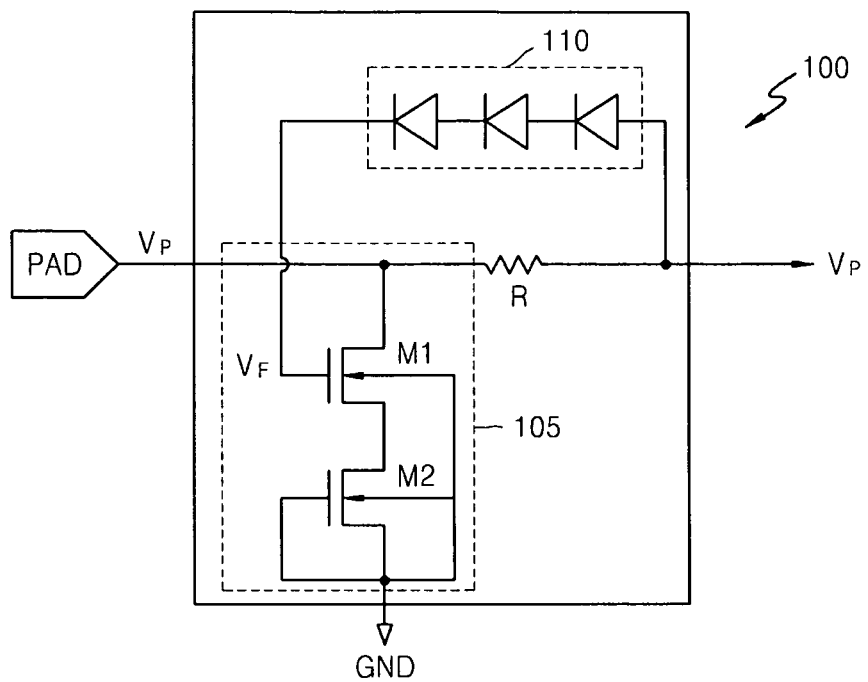
FIG. 1 is a circuit diagram of a pad interface circuit according to an embodiment.

Example embodiments will now be described more fully with reference to the accompanying drawings, in which example embodiments are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

FIG. 1 is an integrated circuit 100 according to an embodiment.

Referring to FIG. 1, integrated circuit 100 comprises a pad interface circuit 105 and a voltage level sensing circuit 110. The integrated circuit 100 includes a first stack metal oxide semiconductor (MOS) transistor M1, a second stack MOS transistor M2 and an electrostatic discharge (ESD) resistor R.

The first stack MOS transistor M1 has a first terminal that is connected to a pad, and a bulk that is connected to a first supply power. The second stack MOS transistor M2 has a first terminal that is connected to a second terminal of the first stack MOS transistor M1 and a second terminal, a gate, and a bulk that are connected to the first supply power. The ESD resistor R is disposed between the first terminal of the first stack MOS transistor M1, to which a pad voltage $V_P$ is applied, and a first terminal of the voltage level sensing circuit 110. The voltage level sensing circuit 110 generates a feedback voltage $V_F$ by using the pad voltage $V_P$ supplied from the pad to the first terminal, and the feedback voltage $V_F$ is applied to a gate terminal of the first stack MOS transistor M1.

The voltage level sensing circuit 110 uses a sensitive device that reduces an input voltage to a desired (or alternatively a predetermined) level, and generates the feedback voltage $V_F$ having relatively lower voltage level than that of the pad voltage $V_P$ by reducing the voltage level of the pad voltage $V_P$ supplied from the pad. Here, a diode may be used as the sensitive device, and referring to FIG. 1, the voltage level sensing circuit 110 may be three diodes that are connected in series. When it is assumed that a turn-on voltage of the diode is about 0.7 V, the voltage level of the feedback voltage $V_F$ will be about 2.1 V lower than that of the pad voltage $V_P$.

Figure 2:
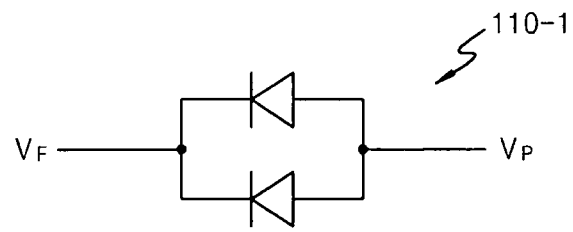
FIG. 2 is a circuit diagram of a voltage level sensing circuit according to an embodiment.
Figure 3:
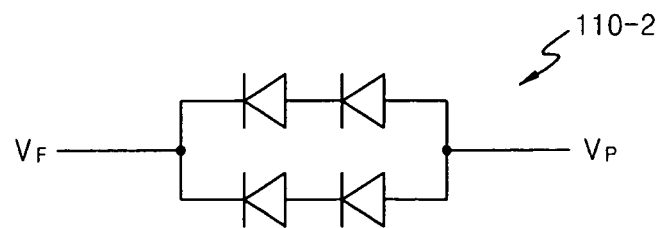
FIG. 3 is a circuit diagram of a voltage level sensing circuit according to another embodiment.
Figure 4:
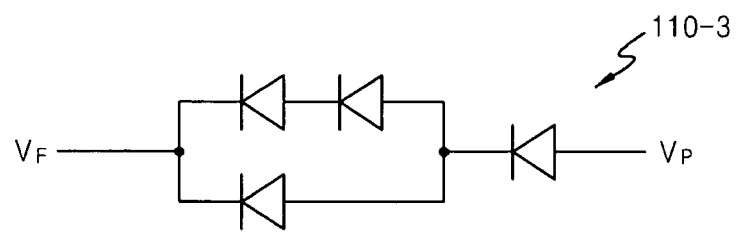
FIG. 4 is a circuit diagram of a voltage level sensing circuit according to another embodiment.

The voltage level sensing circuit 110 may be modified variously, and examples of the voltage level sensing circuit 110 are shown in FIGS. 2 through 4.

FIG. 2 is a schematic showing sensing devices connected in parallel

FIG. 3 is a schematic showing two sensing devices connected in series and parallel.

FIG. 4 is a schematic showing a sensing device connected in series with two sensing devices connected in parallel with a sensing device In addition to the examples shown in FIGS. 2 through 4, the voltage level sensing circuit 110 may be modified variously from the descriptions herein. The first stack MOS transistor M1 and a second stack MOS transistor M2 are N-type MOS transistors.

Hereinafter, operations of the pad interface circuit (105) according to the present embodiment will be described.

It is assumed that an integrated circuit including the pad interface circuit is operated using a first supply voltage GND and a second supply voltage VDD, wherein a voltage level of the second supply voltage VDD is relatively higher than that of the first supply voltage GND. The first supply voltage GND may have a voltage level of a ground voltage or lower. In addition, it is assumed that the voltage level of the pad voltage $V_P$ supplied from the pad is about 5V when the voltage level of the second supply voltage VDD is about 3.3V.

When the pad supplies a voltage level of about 5V, which is higher than the voltage level 3.3 V of the second supply voltage VDD, a difference between the voltage level of the feedback voltage $V_F$, which is applied to the gate of the first stack MOS transistor M1, and the voltage level of the pad voltage $V_P$ applied to the first terminal of the first stack MOS transistor M1 is 2.1 V. Therefore, an electric field corresponding to a voltage level of 2.1 V is generated across a gate oxide layer in the first stack MOS transistor M1.

While the difference between the voltages applied to the gate of the first stack MOS transistor M1 and a source or a drain is 2.1V, the difference between the voltage applied to the gate of a general transistor and a source or a drain is over 3 V. Therefore, the electric field supplied by a gate oxide layer of the first stack MOS transistor M1 may be smaller than that of a general transistor.

In the voltage level sensing circuit 110 illustrated in FIG. 1, three diodes are connected in series. However, in order to generate the feedback voltage $V_F$ finely, the number of sensing devices connected in series may be adjusted or the sensing devices may be connected in parallel as shown in FIGS. 2 through 4. In particular, if the serial connection and the parallel connection of the sensing devices are used together, the feedback voltage $V_F$ may be generated very finely.

The pad interface circuit of the present embodiment can be compared with the conventional pad interface circuit as follows.

Figure 5:
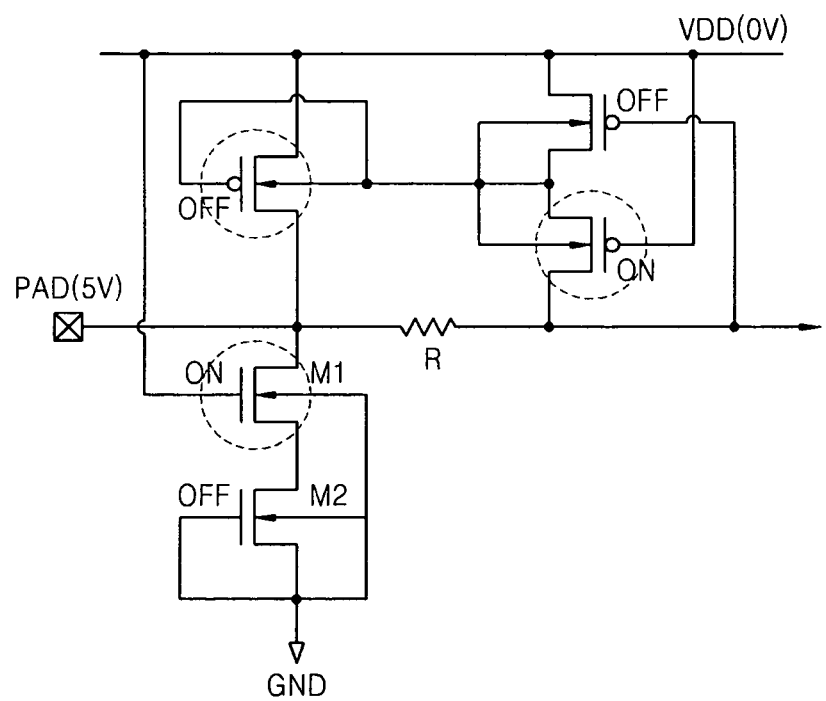
FIG. 5 is a circuit diagram of a conventional pad interface circuit.

FIG. 5 is a circuit diagram of a pad interface circuit according to the conventional art.

Referring to FIG. 5, when a voltage level of a second supply voltage VDD of an integrated circuit is ground voltage (0V) and a 5V voltage source is supplied to the pad interface circuit from a pad, an electric field corresponding to 5V is generated in the gate oxide layers of the three transistors which are represented as dotted circles, and accordingly, the electric shock applied to the gate oxide layer becomes greater than that of the pad interface circuit according to the present embodiment.

Figure 6:
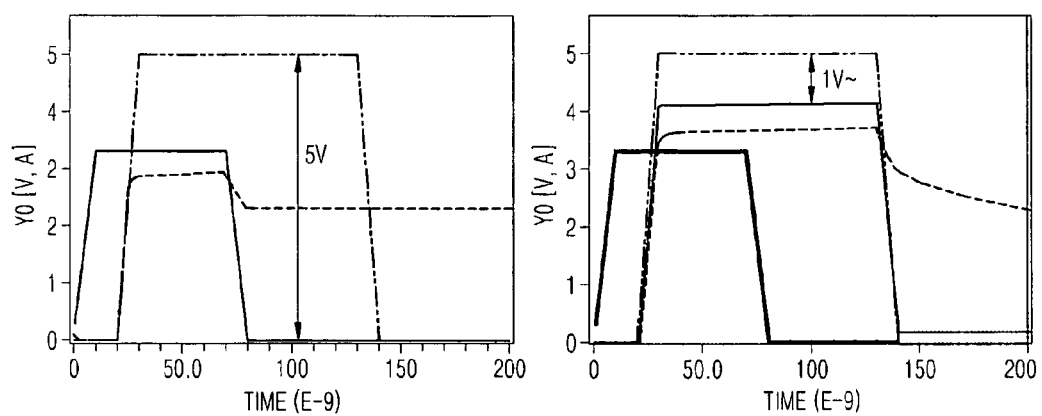
FIG. 6 shows computer simulation results of the pad interface circuit according to the conventional art and the pad interface circuit according to the embodiment.

FIG. 6 is a graph plotting computer simulation results of the conventional pad interface circuit and the pad interface circuit according to the present embodiment.

Referring to FIG. 6, when the second supply voltage VDD is not supplied, in the conventional pad interface circuit, which is shown on left side of FIG. 6, the 5V voltage from the pad is applied to the gate terminal of the transistor, however, in the pad interface circuit according to the present embodiment, which is shown on right side of FIG. 6, a voltage of about 1V is applied to the gate terminal of the MOS transistor. Here, the voltage of 1V is determined according to the configuration of the voltage level sensing circuit, and a voltage having the voltage level lower than 1V may be applied.

While embodiments have been particularly shown and described, it will be understood that various changes in form and details may be made therein without departing from the spirit and scope of the following claims.

What is claimed is:

1. A pad interface circuit comprising:
a first stack metal oxide semiconductor (MOS) transistor having a first terminal connected to a pad and a bulk connected to a first supply voltage;
a second stack MOS transistor having a first terminal connecting to a second terminal of the first stack MOS transistor and a second terminal, a gate terminal, and a bulk that are connected to the first supply voltage; and
a voltage level sensing circuit generating a feedback voltage by using a pad voltage supplied from the pad, wherein the feedback voltage is supplied to a gate terminal of the first stack MOS transistor.

2. The pad interface circuit of claim 1, further comprising:
an electrostatic discharge (ESD) resistor that is disposed between the first terminal of the first stack MOS transistor and a terminal of the voltage level sensing circuit to which the pad voltage is applied.

3. The pad interface circuit of claim 1, wherein the voltage level sensing circuit generates the feedback voltage by reducing a voltage level of the pad voltage.

4. The pad interface circuit of claim 3, wherein the voltage level sensing circuit includes one or more sensitive devices that reduce a voltage level of an input signal to a voltage level.

5. The pad interface circuit of claim 4, wherein when a plurality of sensitive devices are included in the voltage level sensing circuit, the sensitive devices are connected in at least one of in series, in parallel, and in both series and parallel.

6. The pad interface circuit of claim 4, wherein the sensitive device is a diode.

7. The pad interface circuit of claim 1, wherein the first supply voltage has a voltage level that is the lowest in a system using the pad interface circuit, and the feedback voltage has a voltage level that is determined according to a voltage level of a second supply voltage applied to the system including the pad interface circuit and a voltage level of a voltage source applied to the pad.

8. The pad interface circuit of claim 1, wherein the first stack MOS transistor and a second stack MOS transistor are N-type MOS transistors.

9. A method of improving reliability of a pad interface circuit, the pad interface circuit including a first stack MOS transistor having a first terminal connected to a pad and a bulk connected to a first supply voltage, and a second stack MOS transistor having a first terminal connected to a second terminal of the first stack MOS transistor and a second terminal, a gate terminal, and a bulk that are connected to the first supply voltage, the method comprising:
applying a feedback voltage to the gate terminal of the first stack MOS transistor, the feedback voltage having a voltage level that is equal to or smaller than a difference between voltage levels of a voltage supplied from the pad and a output voltage of the pad interface circuit, the output voltage configured to be supplied to a system connected to the pad interface circuit.

10. The method of claim 9, wherein the first supply voltage has the lowest voltage level among supply voltages applied to the system using the pad interface circuit, and the output voltage has the highest voltage level among the supply voltages supplied to the system using the pad interface circuit.

11. An integrated circuit, comprising:
a pad interface circuit including,
a first stack MOS transistor having a first terminal connected to a pad and bulk that is connected to a first power supply, and
a second stack MOS transistor having a first terminal connected to a second terminal of the first stack MOS transistor, a second terminal, a gate, and a bulk that are connected to the first power supply; and
a voltage level sensing-circuit configured to generate a feedback voltage that is applied to a gate of the first stack MOS transistor based on a pad voltage applied to the pad interface circuit.

12. The integrated circuit of claim 11, wherein the voltage level sensing-circuit is configured to reduce the feedback voltage applied to at least one gate oxide layer of the pad interface circuit.

13. The integrated circuit of claim 11, wherein the voltage level sensing-circuit is configured to generate the feedback voltage applied to the gate of the first stack MOS transistor based on the pad voltage to control an electric field applied to a gate oxide layer of the first stack MOS transistor.

14. The integrated circuit of claim 13, wherein the voltage level sensing-circuit comprises of at least one diode.

15. The integrated circuit of claim 13, wherein the voltage level sensing-circuit comprises of a plurality of diodes.

16. The integrated circuit of claim 11, wherein an ESD resistor is disposed between the first terminal of the first stack MOS transistor and a first terminal of the voltage level sensing-circuit.

17. The integrated circuit of claim 11, wherein the voltage level sensing-circuit is disposed between the pad and the gate of the first stack MOS transistor.

* * * * *